United States Patent [19]

Wein

[11] Patent Number: 4,571,499
[45] Date of Patent: Feb. 18, 1986

[54] CIRCUIT ARRANGEMENT FOR SWITCHOVER OF LOAD BETWEEN DIFFERENT SOURCES OF ALTERNATING VOLTAGE

[75] Inventor: Franz Wein, Beratzhausen, Fed. Rep. of Germany

[73] Assignee: Maschinenfabrik Reinhausen Gebruder Scheubeck GmbH & Co. KG, Regensburg, Fed. Rep. of Germany

[21] Appl. No.: 579,848

[22] Filed: Feb. 13, 1984

[30] Foreign Application Priority Data

Feb. 12, 1983 [DE] Fed. Rep. of Germany ....... 3304851

[51] Int. Cl.⁴ .............................................. H02J 3/00
[52] U.S. Cl. ....................................... 307/75; 307/85; 307/113; 307/252 P; 323/258; 323/343
[58] Field of Search ...................... 307/44, 50, 63, 64, 307/66, 75, 77, 80, 85, 113, 140; 323/258, 343; 361/100

[56] References Cited

FOREIGN PATENT DOCUMENTS 2120679 11/1971 Fed. Rep. of Germany .

Primary Examiner—J. R. Scott
Assistant Examiner—Derek S. Jennings
Attorney, Agent, or Firm—Karl F. Ross; Herbert Dubno

[57] ABSTRACT

Two sources of alternating current, such as taps of a supply transformer, are selectively switchable across a load by means of two circuit branches each provided with a main switch and a collateral network in parallel therewith, this network comprising a series combination of a protective resistor, an ancillary switch and a pair of antiparallel thyristors. The gates of the thyristors of each pair are interconnected by a firing resistor in series with a disconnect switch; each gate, furthermore, is connected to its own cathode through a reverse-poled diode which enables the ignition of the opposite thyristor upon closure of the disconnect switch when the proper polarity of the source voltage appears across the network in the closed state of the associated ancillary switch. Prior to a switchover from one source to the other, with only the main switch of one branch closed, the ancillary switch of that branch is closed; this is followed immediately by a closure of the network's disconnect switch whereupon the associated main switch is opened. Next, the ancillary switch and the disconnect switch of the other network are closed in quick succession; there follows the reopening of the disconnect switch and the ancillary switch of the first network, closure of the main switch of the other branch and reopening of the disconnect and ancillary switches associated therewith.

3 Claims, 3 Drawing Figures

CIRCUIT ARRANGEMENT FOR SWITCHOVER OF LOAD BETWEEN DIFFERENT SOURCES OF ALTERNATING VOLTAGE

FIELD OF THE INVENTION

My present invention relates to a circuit arrangement enabling an uninterrupted switchover of a load between different sources of alternating voltage, such as taps of a transformer.

BACKGROUND OF THE INVENTION

Circuit arrangements of the type here considered are frequently used for the selective switching of a load to any of a large number of transformer taps, e.g. as shown in German laid-open application No. 2,120,679 published Nov. 18, 1971. Such a system comprises two mutually identical circuit branches having a common output connected to the load, the inputs of these branches being respectively connected at the time of switchover to a currently active source and a source about to be activated in its stead. When switchover is completed, the input of the now de-energized branch can be transferred to a different source to be next connected across the load. Thus, the load voltage can be selectively increased or reduced by each switching operation.

The system known from the above-identified German publication comprises in each branch a main switch, closed when that branch supplies the load current, and a pair of antiparallel controlled rectifiers or thyristors forming part of a collateral network which shunts the main switch and includes an ancillary switch in series with the thyristors. During steady-state operation, the thyristors of both networks are cut off; their gates are connected to a control unit which receives operating voltage from either of two power supplies that are energized only when the ancillary switch of a respective circuit branch is closed while the associated main switch is open. This condition occurs only at a stage of beginning activation of that branch. The control unit then applies voltage to the gates of both thyristor pairs, enabling first a thyristor of the branch undergoing deactivation and next a thyristor of the branch about to be activated to fire during two consecutive half-cycles of the transformer voltage. Conduction of the first thyristor is initiated by the opening of the main switch of the branch being deactivated; closure of the other main switch must be timed to occur about one cycle later, i.e. upon termination of conduction of the second thyristor, since the control unit does not allow any thyristor to be fired more than once.

The use of two pairs of antiparallel thyristors diminishes arcing at the main switches during the changeover from one source to another, yet the aforedescribed system is complex and requires thyristors able to be rapidly fired and quenched.

OBJECT OF THE INVENTION

The object of my present invention, therefore, is to provide an improved circuit arrangement for the purpose described which is of much simpler structure and can operate with less expensive, slower-reacting thyristors.

SUMMARY OF THE INVENTION

A circuit arrangement according to my invention has the same basic structure as that of the above-identified German publication, namely two circuit branches with respective main switches and collateral networks which each include a pair of antiparallel thyristors in series with a respective ancillary switch. Each network further includes a protective series resistor; such series resistors are likewise known from the German publication where, however, they are shunted by associated fuses so that their function is only to provide a measure of continuity when a fuse is blown. Instead of the power supplies and the control unit of the known system, however, I provide each network with a disconnect switch inserted between the gates of the respective thyristor pair, the gate and the cathode of each thyristor being interconnected by a diode so poled that the opposite thyristor of the pair will conduct during a corresponding half-cycle of the source voltage when the disconnect switch and the ancillary switch of that network are closed. During such closure, the two thyristors paired with each other will periodically conduct in respective half-cycles; simultaneous conduction of the thyristors of both pairs, which the German publication studiously avoids, is unobjectionable if limited to a brief period preferably lasting for several half-cycles. Short circuits between the two voltage sources during simultaneous conduction are avoided by the presence of the protective resistors which are not shunted by fuses liable to blow at such time. The two oppositely poled diodes of each network, which are in bucking relationship when the associated switch is closed, can be further protected by the interposition of a firing resistor in series with that disconnect switch.

BRIEF DESCRIPTION OF THE DRAWING

The above and other features of my invention will now be described in detail with reference to the accompanying drawing in which.

SPECIFIC DESCRIPTION

Figure 1:
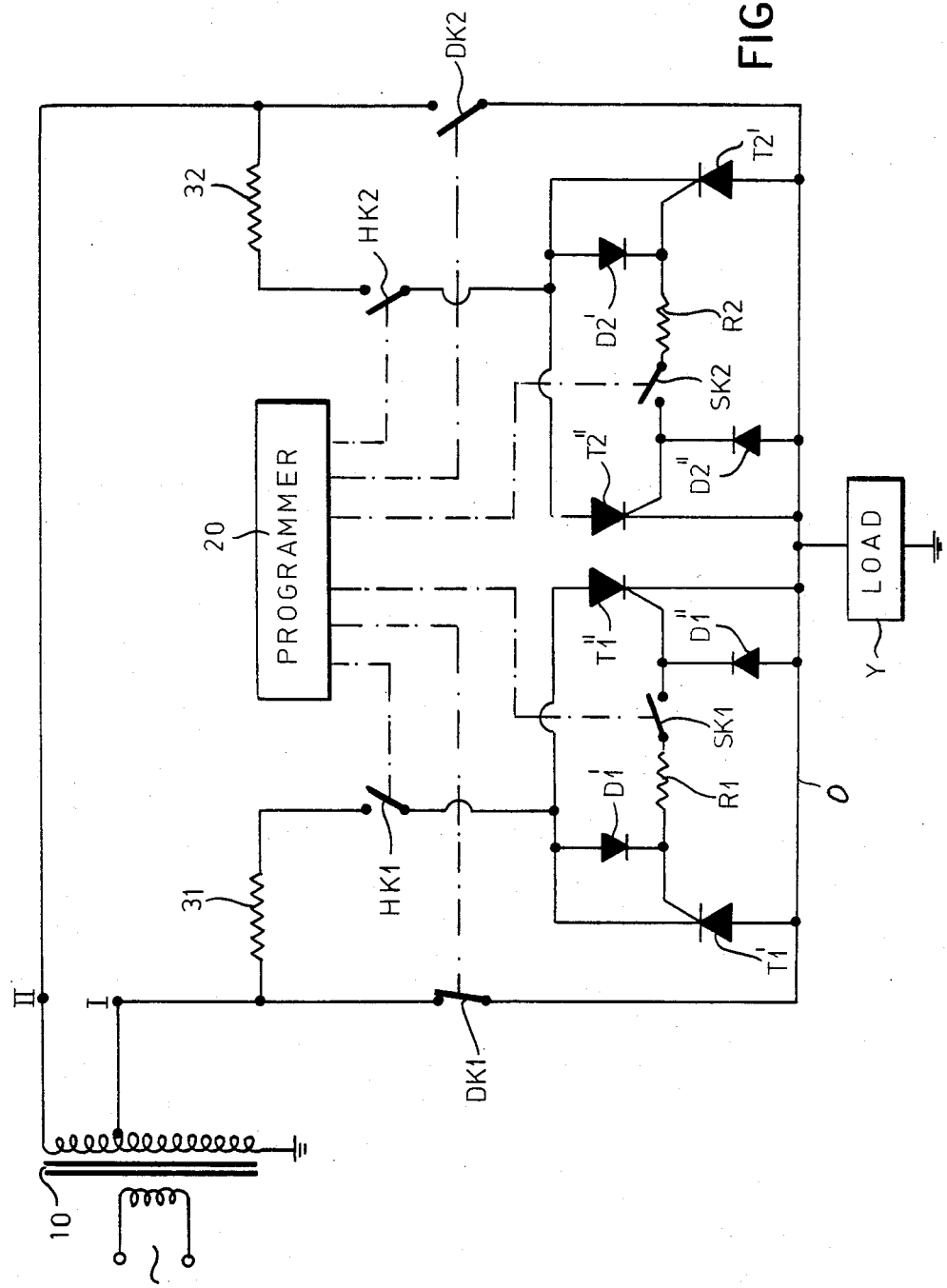
FIG. 1 is a circuit diagram of a switchover system embodying my invention.

The circuit arrangement shown in FIG. 1 comprises a supply transformer 10 whose secondary is tapped at several locations to supply alternating voltage of the same frequency but different amplitudes. Two such taps are connected at a given time to input terminals I and II of respective circuit branches serving for the ultimate energization of a load Y; each branch includes a main switch DK1, DK2, switch DK1 being shown closed in the illustrated position whereby load Y is energized through the left-hand branch by way of input terminal I.

Switch DK1 is shunted by a collateral network comprising a protective resistor 31 in series with an ancillary switch HK1 and a pair of antiparallel thyristors T1' and T1" which are non-conductive in steady-state operation when switch HK1 is open. Two rectifying diodes D1' and D1" are respectively connected across the gate/cathode circuits of thyristors T1' and T1", with the cathode of each diode joined to the gate of the associated thyristor. The two thyristor gates are interconnectable by a normally open switch SK1 in series with a firing resistor R1.

The right-hand branch of the circuit arrangement shown in FIG. 1 has a structure symmetrical to that just described, including a collateral network with a protective resistor 32, a normally open ancillary switch HK2 and a pair of antiparallel thyristors T2", all connected in series across main switch DK2 which is shown in open position. The network further includes two rectifying diodes D2' and D2" respectively connected across the gate/cathode circuits of thyristors T2' and T2". An open disconnect switch SK2 lies between the gates of these thyristors in series with a firing resistor R2. Switches DK1, DK2, the anodes of thyristors T1', T2' and the cathodes of thyristors T1", T2" are connected to load Y by a common output lead O.

All switches DK1, HK1, SK1 and DK2, HK2, SK2 are controlled by a programmer 20, started manually or otherwise at the beginning of a switchover operation, in a predetermined sequence as described hereinafter with reference to FIG. 2. The programmer could be a mechanical actuator, such as a camshaft, or an electronic component controlling respective solenoids, for example.

Figure 2:
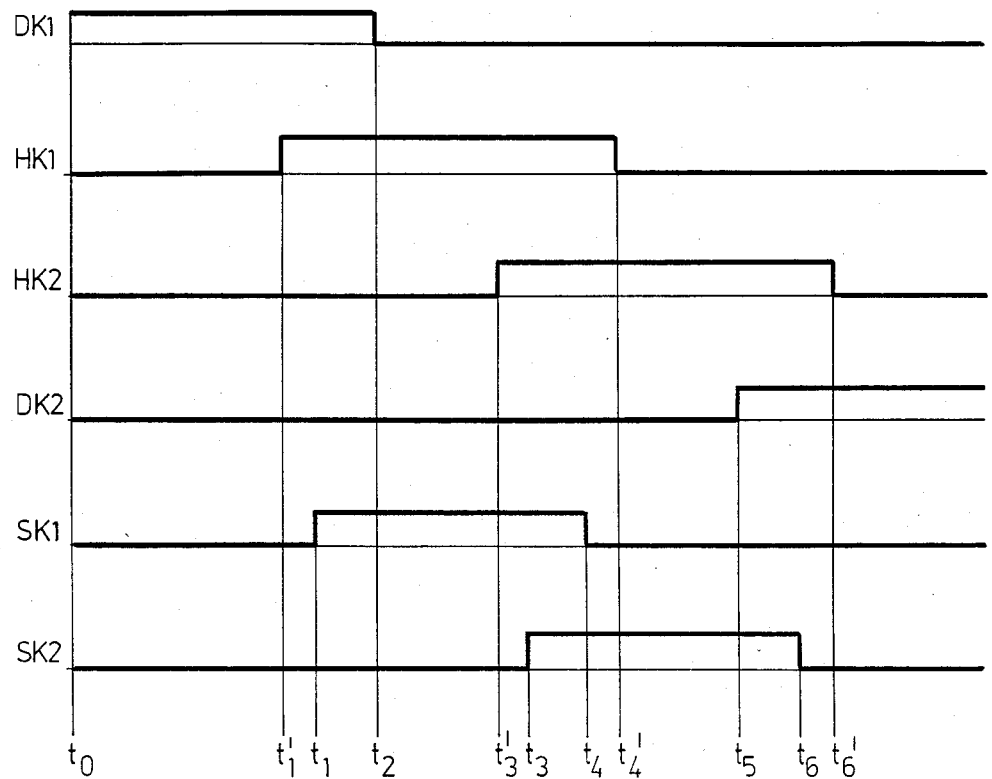
FIG. 2 is a set of graphs showing the relative timing of the operations of the several switches of FIG. 1 during a changeover from one source to another.
Figure 3:
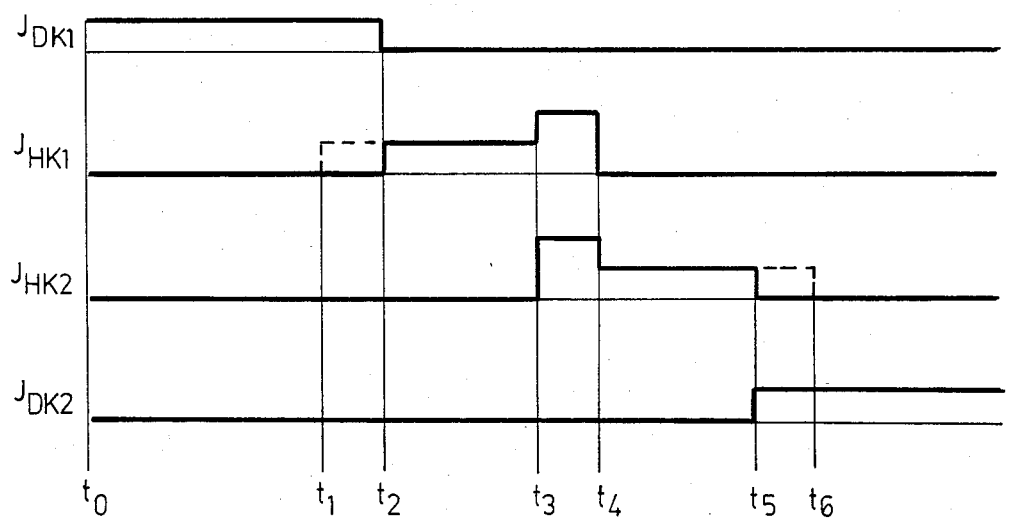
FIG. 3 is a similar set of graphs illustrating the current flow through some of these switches.

Before the start of a switchover program, at an instant $t_0$ indicated in FIGS. 2 and 3, the system is assumed to be in the position illustrated in FIG. 1 with only switch DK1 closed (FIG. 2) and traversed by current $J_{DK1}$ (FIG. 3). At an instant $t_1'$, switch HK1 is closed; neither of the associated thyristors T1' and T1", however, conducts at this time since their gates cannot receive firing potential through the reverse-poled diodes T1' and T1" connected thereto. At an instant $t_1$, following shortly after the closure of switch HK1, disconnect switch SK1 is closed whereby the gates of these thyristors are alternately able to receive positive voltage through the respectively opposite diodes and the firing resistor R1, depending on the polarities of the half-cycles then in progress. Such voltage, however, will not become effective until the short circuit through main switch DK1 is broken by the opening of that switch at a subsequent instant $t_2$. The two thyristors T1" and T1" will now alternately fire, during respective half-cycles, so that switch HK1 is traversed by current $J_{HK1}$ for an indefinite period.

At a time $t_3'$ the programmer closes the other ancillary switch HK2, this being followed in quick succession by closure of disconnect switch SK2 at an instant $t_3$. Alternate conduction of thyristors T2' and T2" begins immediately, as indicated in FIG. 3 by the flow of current $J_{HK2}$ through switch HK2. Owing to the autotransformer effect, the current drawn from terminal II reinforces and is reinforced by the current $J_{HK1}$ passing from terminal I to the load. The two currents, of course, are limited by the protective resistors 31 and 32.

After an interval of several half-cycles, namely at an instant $t_4$, disconnect switch SK1 is opened whereby conduction through thyristors T1" and T1" ceases, current $J_{HK1}$ goes to zero and current $H_{HK2}$ diminishes. Shortly thereafter, at an instant $t_4'$, the programmer opens the ancillary switch HK1 in preparation for closure of main switch DK2. That closure occurs at a subsequent instant $t_5$ and short-circuits the active thyristors T2', T2" whereby current $J_{HK2}$ disappears, allowing switches SK2 and HK2 to be opened without arcing at respective instant $t_6$ and $t_6'$ closely following one another. This establishes a new steady-state operation with the load Y energized from input II instead of input I.

It will be apparent that input I can now be connected to a different tap of the secondary of transformer 10 preparatorily to a further switchover.

Advantageously, all intervals $t_1'-t_1$, $t_3'-t_3$, $t_4-t_4'$ and $t_6-t_6'$ slightly exceed one half-cycle; this ensures that any bouncing of contacts upon closure of switches HK1 and HK2 will be terminated when the associated thyristors are to go into conduction and that, in turn, the thyristors will have been completely cut off when the switch in series therewith is being opened. The other intervals shown in FIGS. 2 and 3 are longer but their duration is not critical.

While some arcing will still occur upon the opening of main switch DK1 at instant $t_2$ and of its counterpart DK2 upon reverse switchover, such arcing could be suppressed by providing each main switch with an additional thyristor pair connectable in parallel therewith and triggerable at the proper time by programmer 20.

I claim:

1. A circuit arrangement for an uninterrupted switchover of a load between two different alternating current supply points at respective voltage levels, comprising:

a first and a second circuit branch having inputs respectively connected to said supply points and having a common output connected to said load;

a first and a second main switch respectively inserted between said common output and the inputs of said first and second branches;

a first and a second collateral network respectively connected across said first and said second main switch, said first network including a first protective resistor, a first ancillary switch and a first pair of antiparallel thyristors in series with one another, said second network including a second protective resistor, a second ancillary switch and a second pair of antiparallel thyristors in series with one another, each thyristor having an anode, a cathode and a gate;

a first disconnect switch inserted between the gates of the thyristors of said first pair;

two first diodes each inserted between the gate and the cathode of one thyristor of said first pair with a polarity corresponding to that of the respectively other thyristor of said first pair for firing the latter thyristor in a closed state of said first disconnect switch upon application of voltage of a corresponding polarity across said first pair of thyristors;

a second disconnect switch inserted between the gates of the thyristors of said second pair;

two second diodes each inserted between the gate and the cathode of one thyristor of said second pair with a polarity corresponding to that of the respectively other thyristor of said second pair of firing the latter thyristor in a closed state of said second disconnect switch upon application of voltage of a corresponding polarity across said second pair of thyristors; and timing means operable during a switchover from one supply point to the other, with only the main switch of one branch initially closed and all other switches open, to control said switches in a sequence involving closure of the ancillary and disconnect switches of said one branch, opening of the main switch of said one branch, closure of the ancillary and disconnect switches of the other branch, opening of the disconnect and ancillary switches of said one branch, closure of the main switch of said other branch, and opening of the disconnect and ancillary switches of said other branch.

2. A circuit arrangement as defined in claim 1 wherein said timing means is programmed to close the disconnect switch after closure of the ancillary switch and to open the ancillary switch after opening of the disconnect switch in each of said branches.

3. A circuit arrangement as defined in claim 1, further comprising a first and a second firing resistor respectively connected in series with said first and said second disconnect switch between the gates of said first and said second pair of thyristors.

* * * * *